United States Patent
Bohinsky et al.

(10) Patent No.: US 11,789,086 B1
(45) Date of Patent: Oct. 17, 2023

(54) CELL AND RACK PERFORMANCE MONITORING SYSTEM AND METHOD

(71) Applicant: Fluence Energy, LLC, Arlington, VA (US)

(72) Inventors: Amy Bohinsky, Austin, TX (US); John T. Guerin, Los Alamitos, CA (US); Abhishek Malik, Pittsburgh, PA (US); Kashish Patel, Norristown, PA (US)

(73) Assignee: Fluence Energy, LLC, Arlington, VA (US)

( * ) Notice: Subject to any disclaimer, the term of this patent is extended or adjusted under 35 U.S.C. 154(b) by 0 days.

(21) Appl. No.: 17/810,983

(22) Filed: Jul. 6, 2022

(51) Int. Cl.
G01R 31/3835 (2019.01)
G01R 19/00 (2006.01)
G01R 19/30 (2006.01)
G01R 31/396 (2019.01)

(52) U.S. Cl.
CPC ....... *G01R 31/3835* (2019.01); *G01R 19/003* (2013.01); *G01R 19/30* (2013.01); *G01R 31/396* (2019.01)

(58) Field of Classification Search
CPC .......................... G01R 31/396; G01R 31/3835
USPC ......................................................... 702/104
See application file for complete search history.

(56) References Cited

U.S. PATENT DOCUMENTS

| | | |
|---|---|---|
| 2007/0002536 A1 | 1/2007 | Hall et al. |
| 2010/0059270 A1 | 3/2010 | Yeh et al. |
| 2012/0086399 A1 * | 4/2012 | Choi ............... H02J 7/0016 320/116 |
| 2014/0210419 A1 | 7/2014 | Kim |
| 2015/0003009 A1 | 1/2015 | Moore et al. |
| 2015/0194707 A1 * | 7/2015 | Park ............... H02J 7/007182 429/61 |
| 2015/0372517 A1 | 12/2015 | Lee |
| 2017/0294633 A1 | 10/2017 | Zimbru et al. |
| 2018/0142935 A1 | 5/2018 | Jacobi |

(Continued)

FOREIGN PATENT DOCUMENTS

WO  2018222858 A1  12/2018

OTHER PUBLICATIONS

International Search Report and Written Opinion for International Application No. PCT/US2021/30551, dated Aug. 13, 2021, 14 pages.

(Continued)

*Primary Examiner* — Ricky Go
(74) *Attorney, Agent, or Firm* — RatnerPrestia

(57) ABSTRACT

A battery cell performance monitoring system includes an energy storage system that includes at least one inverter and battery nodes. Each of the battery nodes includes battery racks, and each of the battery racks includes battery cells. The battery cell performance monitoring system also includes a processor, memory, and programming in the memory. The programming causes the battery cell performance monitoring system to determine an extreme rack cell voltage value of each battery rack. Next, to determine an average extreme rack cell voltage value based on the extreme rack cell voltage value of each battery rack. Further, to compare an extreme rack cell voltage value for each battery rack with the average extreme rack cell voltage value. Additionally, to identify one or more outlier battery racks based upon the comparison of the extreme rack cell voltage value for each battery rack with the average extreme rack cell voltage value.

20 Claims, 8 Drawing Sheets

(56) References Cited

U.S. PATENT DOCUMENTS

2020/0144845 A1* 5/2020 Facchini .................. H02J 50/12
2021/0281081 A1* 9/2021 Singer .................. G01R 31/367

OTHER PUBLICATIONS

Entire patent prosecution history of U.S. Appl. No. 17/915,906, filed Sep. 29, 2022, entitled, "Energy Storage System With Removable, Adjustable, and Lightweight Plenums."
International Search Report and Written Opinion for International Application No. PCT/US22/44366, dated Jan. 6, 2023, 13 pages.

* cited by examiner

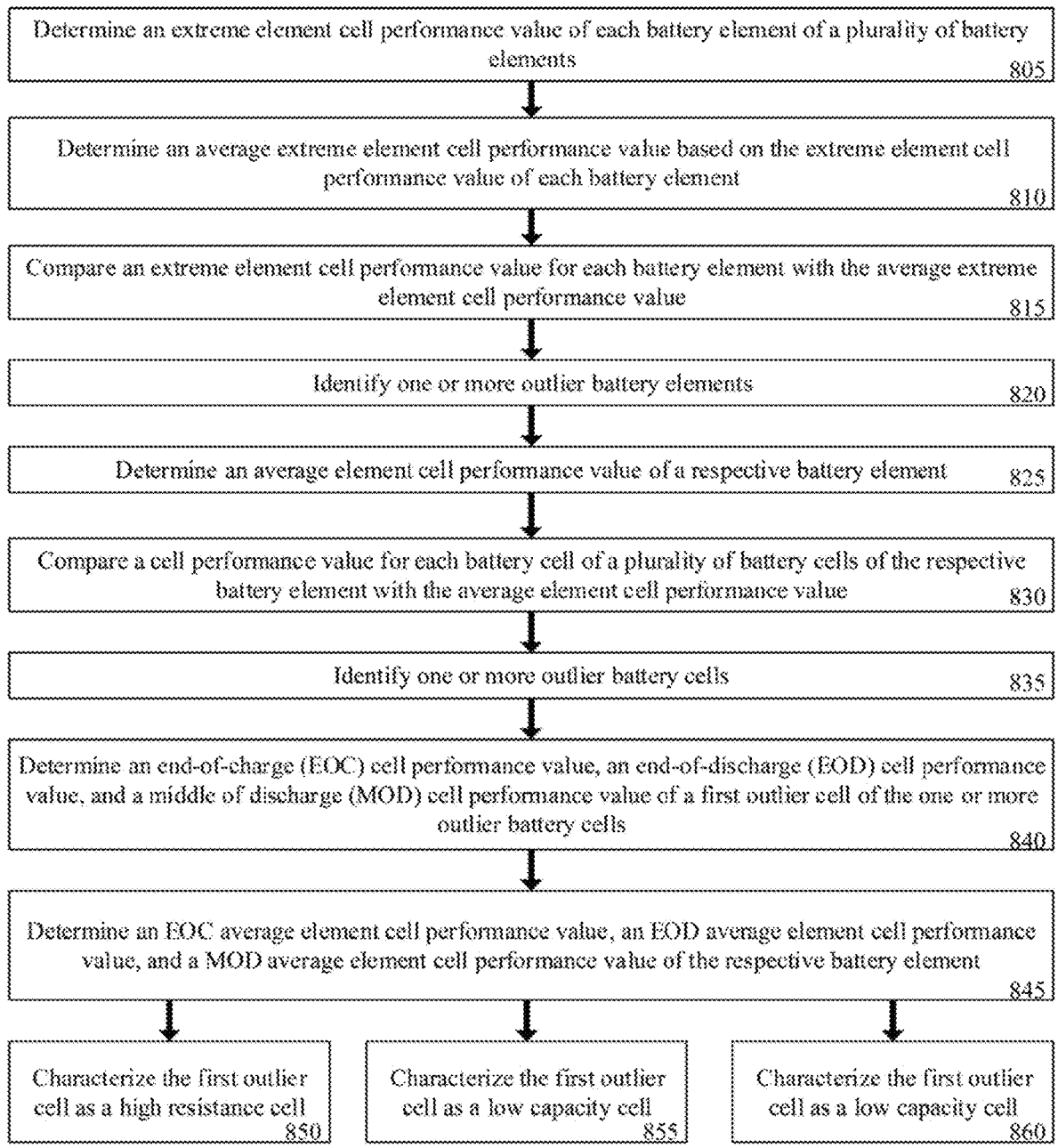

CELL AND RACK PERFORMANCE MONITORING SYSTEM AND METHOD

Technical Field

The present subject matter relates to examples of efficient detection of inefficiently charging or discharging battery cells in an energy storage system made up of multiple battery cells divided into battery racks.

Background

An energy storage system typically includes a multitude of individual battery cells to provide power: in particular, these battery cells work in concert to provide a power inverter with direct current (DC) power, which the inverter then provides out as alternating current (AC) to end usage electrical devices.

When battery cells are networked and wired in such a manner that they function as a single direct current power provision, in most circumstances the battery cells are charged and discharged as a group or as a functional singular battery. Consequently, the collection of individual battery cells can either all charge from an external power source, or can all discharge into an external power target. In order to avoid damage to the battery cells, the collection of battery cells stops charging once a single battery cell in the collection is fully charged; the collection also stops discharging once a single battery cell in the collection is fully discharged.

The charging and discharging capacity of an entire collection of battery cells is therefore limited by its worst-performing charging battery cell and worst-performing discharging battery cell (which may be different battery cells). Consequently, identification of underperforming battery cells is of paramount performance: a single battery cell operating at 50% charging capacity can limit ten thousand other battery cells to only operate at that same 50% capacity. In some systems, low-performing battery cells are only investigated when the system is established, or periodically upon a scheduled inspection, or when a user reports degraded performance. However, there is a compelling interest in identifying low-performing battery cells before performance is noticeably degraded, and potentially isolating, repairing, or replacing the battery cell without affecting devices providing to, or consuming electricity from, the energy storage system.

Auditing the individual battery cell performance as often as every charge or every discharge of the collection of battery cells would provide superior performance information over a one-time, periodic, or reactionary battery cell performance audit. However, assessing the performance of every battery cell in an energy storage system can be computationally expensive. Further, if the battery cells have an extremely low collective failure rate (e.g., one battery cell fails in one thousand charging cycles, 1% of the time) then the value of any individual set of computations is largely wasted (a 1% failure rate in one thousand cycles can result in identifying a failure on average only once in every hundred thousand cycles). However, failures, once they occur, are perpetuated until correction—therefore prompt identification of failures is of paramount importance to maintain optimal performance of the entire energy storage system.

SUMMARY

Hence, there is room for further improvement in methods for identifying low-performing battery cells in an energy storage system, and in energy storage systems that incorporate such methods. The performance monitoring technologies disclosed herein are able to identify a low-performing battery cell in an energy storage system within a single charge or discharge period of a charge cycle, and further can identify a categorization of the type of failure the low-performing battery is experiencing within a single charge cycle. With the performance monitoring technologies, the battery cell performance data can be preliminarily assessed, at a battery node, battery rack, battery module, battery sub-module, or other battery element level, thereby potentially reducing the computational overhead of battery cell auditing by 99% or more.

In a first example, a battery cell performance monitoring system includes an energy storage system that includes at least one inverter and a plurality of battery nodes. Each of the battery nodes includes a plurality of battery racks, and each of the battery racks include a respective plurality of battery cells. The battery cell performance monitoring system also includes a processor and a memory coupled to the processor. The memory comprises performance monitoring programming, which when executed configures the battery cell performance monitoring system to implement the following functions. First, to determine an extreme rack cell voltage value of each battery rack. Second, to determine an average extreme rack cell voltage value based on the extreme rack cell voltage value of each battery rack. Third, to compare the extreme rack cell voltage value for each battery rack with the average extreme rack cell voltage value. Fourth, to identify one or more outlier battery racks based upon the comparison of the extreme rack cell voltage value for each battery rack with the average extreme rack cell voltage value.

In a second example, a method includes first determining an extreme element cell performance value of each battery element of a plurality of battery elements. Second, determining an average extreme element cell performance value based on the extreme element cell performance value of each battery element. Third, comparing an extreme element cell performance value for each battery element with the average extreme element cell performance value. Fourth, based upon the comparison of the extreme element cell performance value for each battery element with the average extreme element cell performance value, identify one or more outlier battery elements.

In a third example, a battery cell performance monitoring system includes an energy storage system that includes at least one inverter and a plurality of battery nodes. Each of the battery nodes includes a plurality of battery elements, and each of the battery elements include a respective plurality of battery cells. The battery cell performance monitoring system also includes a processor and a memory coupled to the processor. The memory comprises performance monitoring programming, which when executed configures the battery cell performance monitoring system to implement the following functions. First, to determine an extreme element cell performance value of each battery rack. Second, to determine an average extreme element cell performance value based on the extreme element cell performance value of each battery element. Third, to compare the extreme element cell performance value for each battery element with the average extreme element cell performance value. Fourth, to identify one or more outlier battery elements based upon the comparison of the extreme element cell performance value for each battery element with the average extreme element cell performance value.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations in accordance with the present concepts, by way of example only, not by way of limitations. In the figures, like reference numerals refer to the same or similar elements.

FIG. 8 is a flowchart depicting a cell and element performance monitoring protocol.

PARTS LISTING

Figure 1:
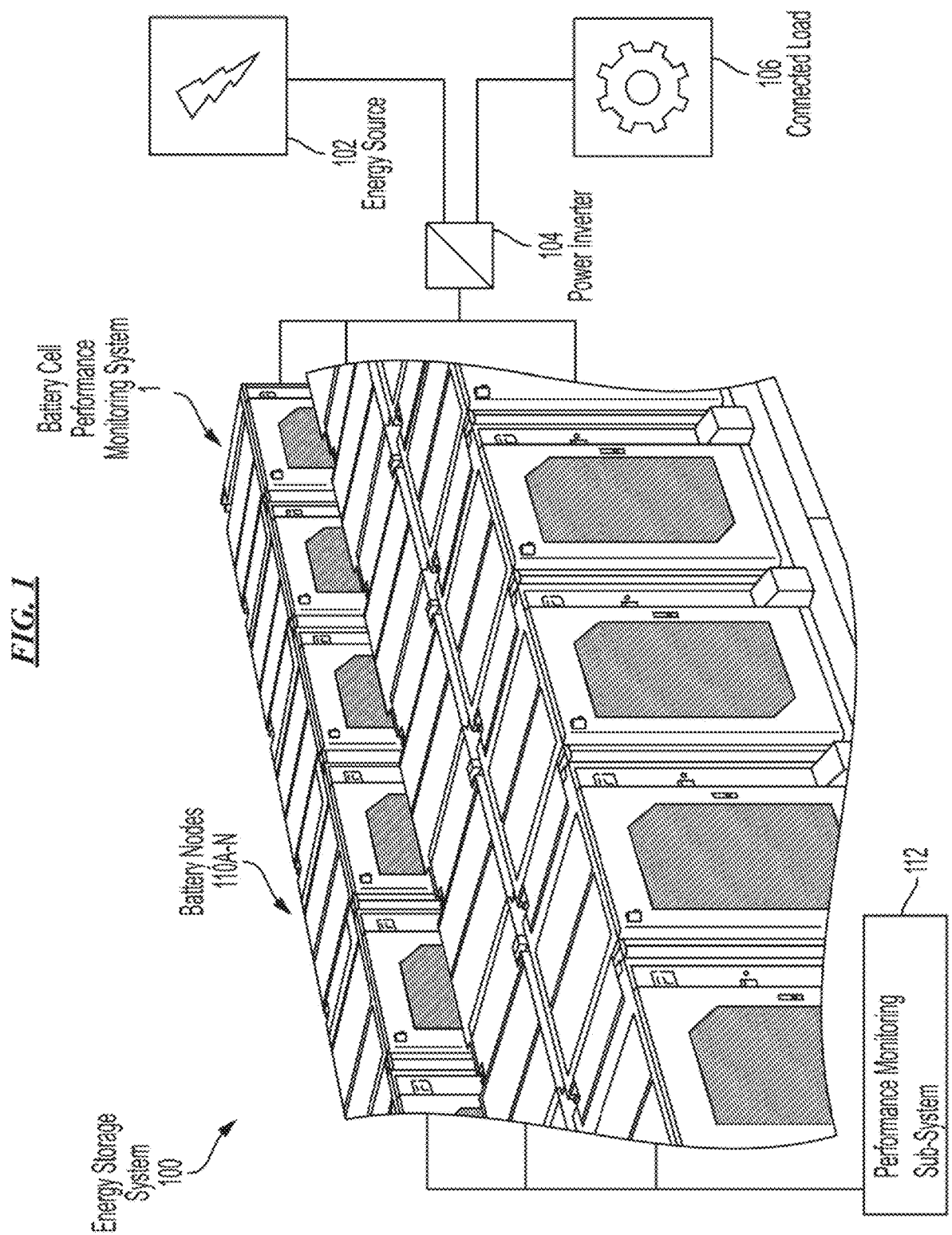
FIG. 1 is an isometric view of an energy storage system that includes multiple battery nodes.

1 Battery Cell Performance Monitoring System
100 Energy Storage System
102 Energy Source
104 Power Inverter
106 Connected Load
110A-N Battery Nodes
112 Performance Monitoring Sub-System
210A-K Battery Elements (e.g., Battery Racks)
212A-R Battery Cells (e.g., Battery Modules)
330 Processor
332 Network Interface
335 Memory
337 Performance Monitoring Programming
339A-G Extreme Element Cell Performance Value (e.g., Extreme Rack Cell Voltage Value)
341 Average Extreme Element Cell Performance Value (e.g., Average Extreme Rack Cell Voltage Value)
343 Outlier Battery Element Identifier (e.g., Outlier Battery Rack Identifier)
345A-D Cell Performance Value
347A Average Element Cell Performance Value
349A-B Outlier Battery Cell Identifier
351 End of Charge (EOC) Cell Performance Value (e.g., EOC Cell Voltage)
353 Middle of Discharge (MOD) Cell Performance Value (e.g., MOD Cell Voltage)
355 End of Discharge (EOD) Cell Performance Value (e.g., EOD Cell Voltage)
361 EOC Element Performance Value (e.g., EOC Rack Voltage Value)
363 MOD Element Performance Value (e.g., MOD Rack Voltage Value)
365 EOD Element Performance Value (e.g., EOD Rack Voltage Value)
501 High Resistance Peak
502 High Resistance Plateau
503 High Resistance Trough
601 Low Capacity Peak
602 Low Capacity Plateau
603 Low Capacity Trough
701 High Out of Balance Peak
702 High Out of Balance Plateau
703 High Out of Balance Trough
751 Low Out of Balance Peak
752 Low Out of Balance Plateau
753 Low Out of Balance Trough
800 Performance Monitoring Protocol

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The term "coupled" as used herein refers to any logical, physical, electrical, or optical connection, link or the like by which signals or light produced or supplied by one system element are imparted to another coupled element. Unless described otherwise, coupled elements or devices are not necessarily directly connected to one another and may be separated by intermediate components, elements, or communication media that may modify, manipulate or carry the light or signals.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount. The terms "approximately" and "substantially" mean that the parameter value or the like varies up to ±10% from the stated amount.

The orientations of the battery nodes, racks, modules, or cells; associated components; and/or any complete devices, such as energy storage systems, incorporating battery nodes, racks, modules, or cells such as shown in any of the drawings, are given by way of example only, for illustration and discussion purposes. In operation for a particular energy storage application, a battery node, rack, module, or cell may be oriented in any other direction suitable to the particular application of the energy storage system, for example upright, sideways, or any other orientation. Also, to the extent used herein, any directional term, such as left, right, front, rear, back, end, up, down, upper, lower, top, bottom, and side, are used by way of example only, and are not limiting as to direction or orientation of any energy storage system or battery nodes, racks, modules or cells; or component of an energy storage system or battery node, rack, 'examples illustrated in the accompanying drawings and discussed below.

FIG. 1 is an isometric view of a battery cell performance monitoring system 1, which primarily includes an energy storage system 100 and a performance monitoring sub-system 112. The energy storage system 100 includes multiple battery nodes 110A-N. The battery nodes 110A-N include batteries of any existing or future reusable battery technology including lithium ion or flow batteries. The battery nodes 110A-N, collectively and individually, are capable of providing direct current electricity to an external load, and thereby discharging, as well as are capable of receiving direct current electricity from an external source, and thereby charging.

To facilitate providing and receiving direct current, the battery nodes 110A-N are connected to one or more power inverters 104. The power inverter 104 is configured to standardize power inputs and outputs to and from the battery nodes 110A-N. As the battery nodes 110A-N provide direct current, the power inverter 104 either transforms direct current into alternating current for use by a connected load 106, normalizes the direct current from the battery nodes 110A-N to the connected load 106, or simply passes the direct current from the battery nodes 110A-N to the connected load. Additionally, as the battery nodes require direct current, the power inverter either transforms alternating current into direct current from an energy source 102, normalizes the direct current from the energy source 102 to the battery nodes 110A-N, or simply passes the direct current from the energy source 102 to the battery nodes 110A-N.

The power inverter is depicted with separate lines to the energy source 102, and the connected load 106: separate lines may be advantageous in scenarios where the energy source 102 is inconsistent, such as a wind or solar-based energy source 102. In such scenarios, the power from the energy source 102 is pushed to the battery nodes 110A-N via a uni-directional power inverter 104, which then either charge or discharge, and provide consistent energy to the connected load 106 via another uni-directional power inverter 104. However, the connected load 106 and the energy source 102 can be connected on the same line to the power inverter 104 via a bi-directional power inverter 104: in scenarios where the energy source 102 is complex and connected to the connected load 106, such as a power grid with consumption devices, a single connection to the energy storage system can either absorb energy produced by the energy source 102 in excess of the demand of the connected load 106, or provide energy to the connected load 106 in excess of the capacity of the energy source 102.

The power inverter 104 may include a power converter as well, to facilitate normalizing input or output wattage or voltage, in order to provide consistent output and protect the battery nodes 110A-N, energy source 102, or connected load 106 from damage.

The energy source 102 can be any suitable system for producing electrical energy, such as a turbine or photovoltaic cell. The connected load 106 can include a power grid or a smaller local load such as a backup power system for a facility such as a hospital, manufacturing site, residential home, or other suitable facility.

The battery cell performance monitoring system 1 includes a performance monitoring sub-system 112 connected to the energy storage system 100, which monitors the battery nodes 110A-N for outlier charging and discharging cycles. Generally, the battery nodes 110A-N of the energy storage system 100 connected to an inverter 104 or group of inverters 104 operate in concert: either providing power to a connected load 106 and discharging, or receiving power from an energy source 102 and charging. Consequently, a defect within a single battery node 110A-N reduces the effectiveness of the entire energy storage system 100. The performance monitoring sub-system 112 is configured to receive power system data from the battery nodes 110A-N connected to the power inverter 104. As discussed in later figures, this data is used to identify poorly-performing battery nodes 110A-N so that action may be taken to recover the performance of the energy storage system 100 despite a poorly-performing battery node 110A.

Figure 2:
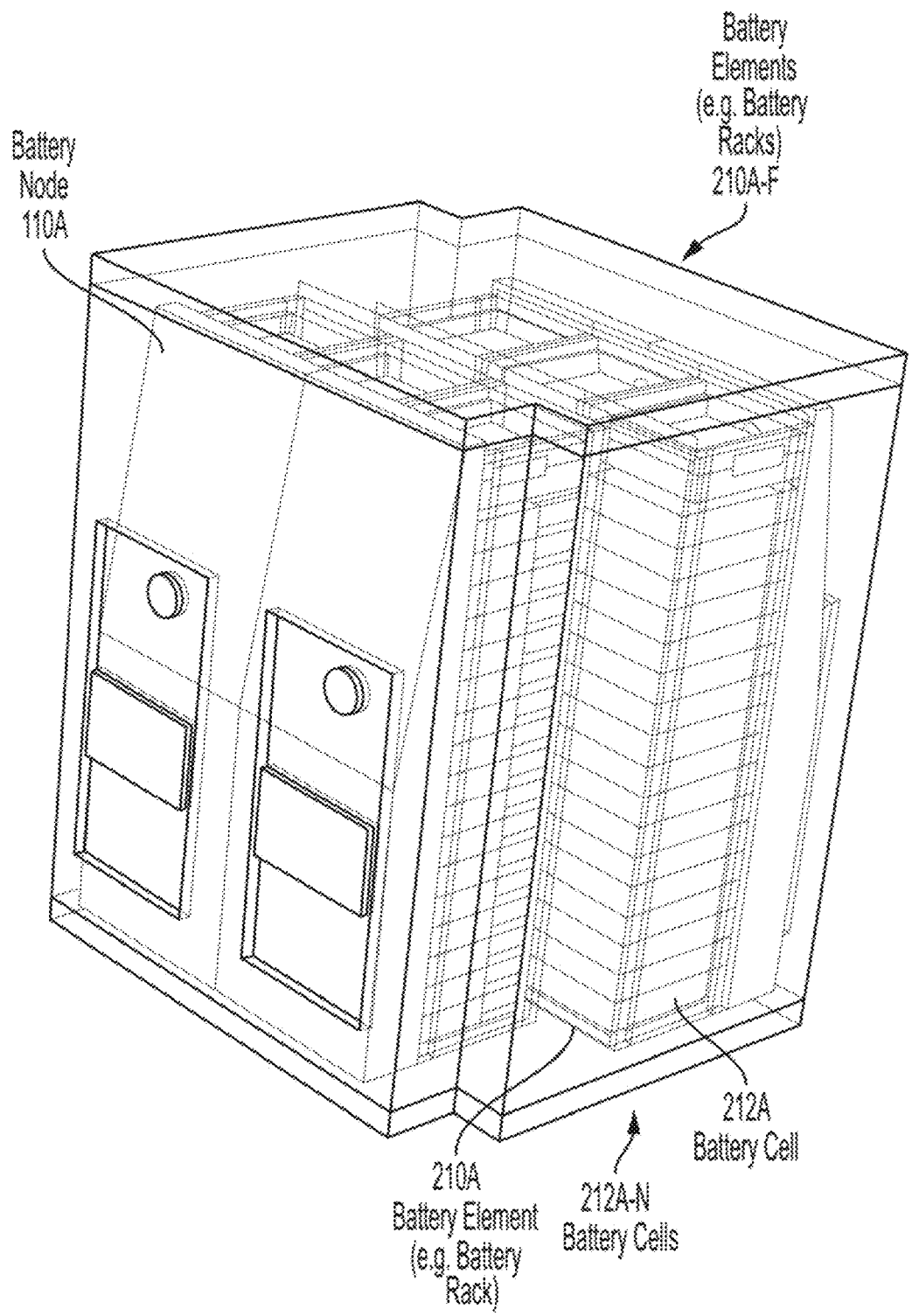
FIG. 2 is an isometric view of a battery node that includes multiple battery racks or elements of multiple battery cells.

FIG. 2 is an isometric view of a battery node 110A that includes multiple battery racks 210A-F of multiple battery cells 212A-N. The battery node 110A stores a plurality of battery racks 210A-F. The battery node 110A is both a physical collection of battery racks 210A-F, as well as a logical and electrical collection of battery racks 210A-F: the battery node 110A physically houses the battery racks 210A-F, and the electrical performance of the battery racks 210A-F within the battery node 110A may be attributed to the battery node 110A itself. For example, if a battery rack 210A is able to store 102 kilowatt hours of energy, and the battery node 110A contains six battery racks 210A-F, then the battery node 110A may be understood to and be described as storing 612 kilowatt hours of energy. A battery node 110A may contain greater or fewer numbers of battery racks 210A than depicted in the figure.

A given battery rack 210A contains multiple battery cells 212A-N. Much like the relationship between a battery node 110A and contained battery racks 210A-F, the battery rack 210A is both a physical collection of battery cells 212A-N as well as a logical and electrical collection of battery cells 212A-N. As an example, if a battery cell 212A is able to store six kilowatt hours of energy, and the battery rack 210A contains seventeen battery cells 212A-N, then the battery node 210A may be understood to and be described as storing 102 kilowatt hours of energy. A battery rack 210A may contain greater or fewer numbers of battery cells 212A than depicted in the figures.

As the battery rack 210A is a logical and electrical collection of battery cells 212A-N, the collection is not defined by the physical structure or ordering of the battery cells 212A-N. Therefore, the battery rack 210A may be alternatively described as a battery module, a battery sub-module, or a battery array: each of these terms (rack, module, sub-module, array) are categories of battery element 210A: a battery element 210A is the logical and electrical collection of battery cells 212A-N, without explicit regard for physical structure or ordering of the battery cells 212A-N. In some implementations, an interstitial level of encapsulation exists between the battery cell 212A and the battery rack 210A or battery element 210A, which may be identified as a battery module within the battery element 210A, containing prismatic, pouch, or cylindrical battery cells 212A-C: in this context the distinction is largely irrelevant, as the primary structural organization concern is logical and electrical, not physical structure or ordering.

The battery node 110A represents a single physical fixture, which may be limited in maximum size by the mass or volume a person, forklift, or vehicle is capable of transporting as a singular, atomic unit. The battery rack 210A or battery element 210A within the battery node 110A represents an organizational structure for organizing and stacking the battery cells 212A-N within the battery node 110A. A battery cell 212A is generally the largest unit of manufacture a battery producer can produce capable of charging and discharging electricity at a chemical level. In some examples, battery cells 212A-C can be grouped into a battery module within the battery elements 210A-F, which would represent the smallest unit a particular operator would remove or replace in the energy storage system 100: in those examples, the individual battery cells 212A are too small or sensitive to perform on-site particularized maintenance, and instead the entire battery module of battery cells 212A-C is either collectively repaired or replaced. The performance monitoring sub-system 112, as outlined later, may be able to detect outliers at the battery cell 212A level: however, in an energy storage system 100 including battery modules within battery elements 210A-F, an operator would need to replace the entire battery module containing an outlier cell 212A, even if the remaining battery cells 212B-C within the battery module are not performing undesirably.

Figure 3:
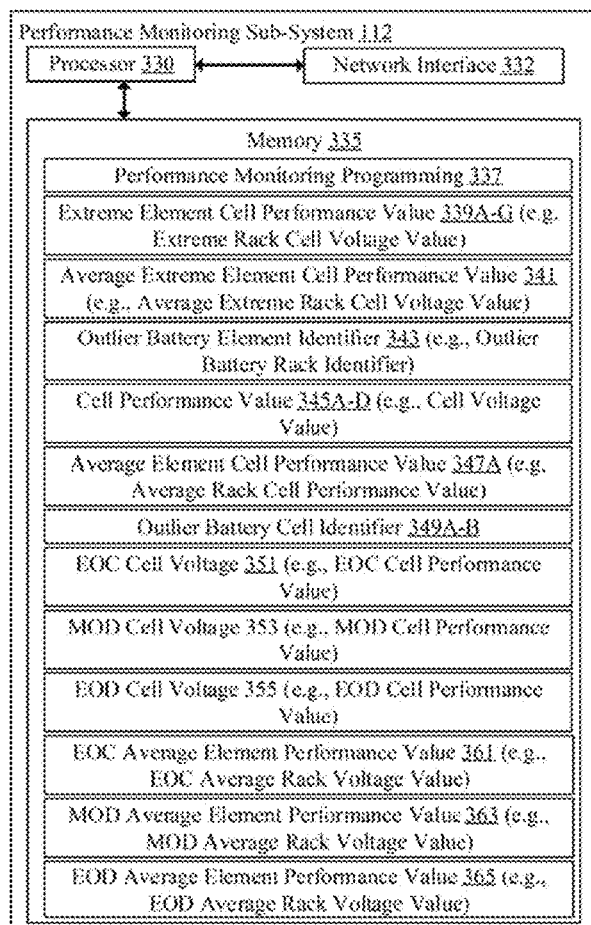
FIG. 3 is a diagram of a performance monitoring subsystem of the battery cell performance monitoring system.
Figure 3:
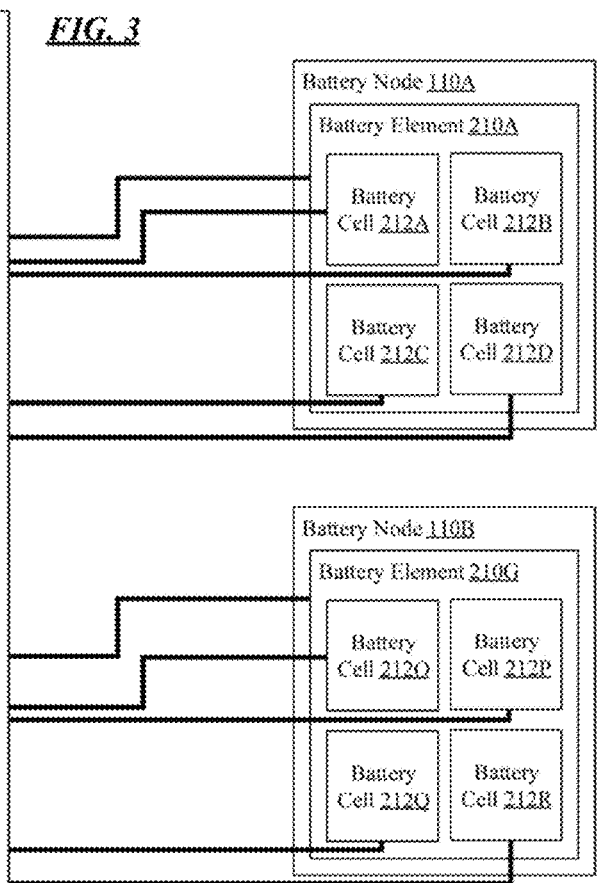

FIG. 3 diagram of a performance monitoring sub-system 112. The performance monitoring sub-system 112 collects performance data regarding all of the battery cells 212A-R in the energy storage system 100, as well as the performance data for each battery rack or element 210A. In other implementations, performance data can be collected at the battery node 110A-B level, as well as performance data for the entire energy storage system 100. In this example, the performance monitoring sub-system 112 is connected to the battery racks or elements 210A-B and battery cells 212A-D, O-R via a wired connection; however, the performance monitoring sub-system 112 may also connect to the battery racks or elements 210A-B and battery cells 212A-D, O-R via a wireless connection.

The performance monitoring sub-system 112 includes a processor 330. The processor 330 serves to perform various operations, for example, in accordance with instructions or programming executable by the processor 330. For example, such operations may include operations related to communications with various energy storage system 100 elements, such as battery nodes 110A-N, power inverter 104, energy source 102, or across a distributed performance monitoring sub-system 112 to implement the performance monitoring protocol 800. Although the processor 330 may be configured by use of hardwired logic, typical processors are general processing circuits configured by execution of programming. The processor 330 includes elements structured and arranged to perform one or more processing functions, typically various data processing functions. Although discrete logic components could be used, the examples utilize components forming a programmable CPU. The processor 330 for example includes one or more integrated circuit (IC) chips incorporating the electronic elements to perform the functions of the CPU. The processor 330 for example, may be based on any known or available microprocessor architecture, such as a Reduced Instruction Set Computing (RISC) using an ARM architecture, as commonly used today in mobile devices and other portable electronic devices. Of course, other processor circuitry may be used to form the CPU or processor hardware. Although the illustrated examples of the processor 330 include only one microprocessor, for convenience, a multi-processor architecture can also be used. A digital signal processor (DSP) or field-programmable gate array (FPGA) could be suitable replacements for the processor 330 but may consume more power with added complexity. 100361 A memory 335 is coupled to the processor 330. The memory 335 is for storing data and programming. In the example, the memory 335 may include a flash memory (non-volatile or persistent storage) and/or a random-access memory (RAM) (volatile storage). The RAM serves as short term storage for instructions and data being handled by the processor 330 e.g., as a working data processing memory. The flash memory typically provides longer term storage.

Of course, other storage devices or configurations may be added to or substituted for those in the example. Such other storage devices may be implemented using any type of storage medium having computer or processor readable instructions or programming stored therein and may include, for example, any or all of the tangible memory of the computers, processors or the like, or associated modules.

The performance monitoring sub-system 112 may also include a network interface 332 coupled to the processor 330. The network interface 332 is configured to report performance data from the battery racks 210A-B and battery cells 212A-D, O-R to a networked server. Additionally, the network interface 332 can collect performance data from the battery racks or elements 210A-B if the battery racks 210A-B are equipped with a network interface, and from the battery cells 212A-D, O-R if the battery cells 212A-D, O-R are equipped with a network interface.

The performance monitoring sub-system 112 may be implemented in a distributed manner: the processor 330 may be divided in to two or more processors, along with two or more memory devices 335. The processors 330 may work in parallel, and may also specialize and perform particular tasks. The memory 335 devices may store a full copy of all performance data, or may specialize and store particular data relevant to a particular processor 330. In an example, the performance monitoring sub-system 112 is divided into a local and remote grouping. A local processor 330, local memory 335, and local network interface 332 can collect performance data from the battery racks or elements 210A-B and battery cells 212A-D, O-R; while a remote processor 330, remote memory 335, and remote network interface 332 can receive the collected data and perform analysis and decision-making.

Performing analysis on the battery racks or elements 210A-B and battery cells 212A-D, O-R in order to detect a low performing or outlier battery cell 212A can be computationally intensive: a full review could be performed at the end of every charging period and discharging period, every charge cycle. In particular, if any battery cell 212A-D, O-R is very unlikely to be an outlier in any given charge cycle, the product of the computation is often of low actionable value if the product does not identify an outlier battery cell 212A. Therefore, the analysis process seeks an outlier battery cell 212A in at least two phases: first, at a battery rack or element 210A level (does the battery rack 210A contain an outlier battery cell 212A?) and second, at the battery cell 212A-D level within the battery rack or element 210A from the first phase (which battery cell 212A of the battery cells 212A-D is an outlier in this battery rack 210A?)

To facilitate this process, the memory 335 includes several objects. In particular, the performance monitoring programming 337 is the programming which implements the performance monitoring protocol 800.

An extreme rack cell voltage value 339A is the most extreme voltage value of any battery cell 212A-D within a given battery rack 210A. The "extreme" voltage value can either be a high voltage value, or a low voltage value. Generally, at the end-of-charge (EOC) the extreme voltage value is a high voltage value, and at end-of-discharge (EOD the extreme voltage value is a low voltage value. Each functional battery rack 210A-G in the energy storage system 100 should have an extreme rack cell voltage value 339A-G. The extreme rack cell voltage value 339A may be more broadly identified as an extreme element cell performance value 339A: the extreme element cell performance value 339A may encompass performance values beyond voltage, such as amperage or temperature: values which describe or effect the performance of any battery cell 212A-D within a given battery element 210A. For example, the "extreme" performance value can be a high temperature value, or a low amperage value.

An average extreme rack cell voltage value 341 is the averaged value of each extreme rack cell voltage value 339A-G. Each extreme rack cell voltage value 339A-G used in the average extreme rack cell voltage value 341 is collected from the same EOC or EOD, in order to perform a one-to-one comparison of performance. The average extreme rack cell voltage value 341 may be more broadly identified as an average extreme element cell performance value 341: The average extreme element cell performance value is the averaged value of each extreme element cell performance value 339A-G.

Once the average extreme rack cell voltage value 341 is calculated, each extreme rack cell voltage value 339A-G is individually compared to the average extreme rack cell voltage value 341. If an extreme rack cell voltage value 339A substantially deviates and is excessively high voltage or excessively low voltage, then the battery rack 210A associated with that extreme rack cell voltage value 339A is identified as an outlier battery rack with an outlier battery rack identifier 343. A "substantial deviation", "excessively high voltage", or "excessively low voltage" can be a deviation from the average of as little as one percent. Alternatively described, each extreme element cell performance value 339A-G is individually compared to the average extreme element cell performance value 341, and an extreme element cell performance value 339A substantially deviating from the average extreme element cell performance value 341 identifies an outlier battery element with an outlier battery element identifier 343.

Once an outlier battery rack identifier 343 identifies an outlier battery rack 210A, or an outlier battery element identifier 343 identifies an outlier battery element 210A, the performance monitoring sub-system 112 seeks out the battery cell 212A which caused the battery rack or element 210A to be identified as an outlier. The cell voltage value 345A-D of each battery cell 212A-D in the outlier rack or element 210A is recorded in the memory 335, or alternatively the cell performance value 345A-D of each battery cell 212A-D in the outlier rack or element 210A is recorded in the memory. Based on the cell voltage values 345A-D, an average rack cell voltage value 347A is calculated, which is an average of the cell voltage values 345A-D. Alternatively, based on the cell performance values 345A-D, an average element cell performance value 347A is calculated, which is an average of the cell performance values 345A-D.

Once the cell voltage values 345A-D or cell performance values 345A-D are collected from a given EOD or EOC of a charge cycle, and an average rack cell voltage value 347A or an average element cell performance value 347A is calculated, any battery cell 212 with a substantial deviation is identified as an outlier battery cell 212A and the outlier battery cell identifier 349A is stored in the memory 335. A charge cycle may be commenced at any point in the charge cycle: the charge cycle may commence with discharging the energy storage system 100 or sub-components, reaching EOD, charging the energy storage system 100, and reaching EOC. Alternatively, the charge cycle may commence with charging the energy storage system 100, reaching EOC, discharging the energy storage system 100, and reaching EOD. In particular, when an energy storage system 100 is initialized, the charge state any battery cell 212 may be unknown: in some cases the battery cells 212 are partially charged. The operator may choose to either move the energy storage system 100 toward EOD, or toward EOC, in order to sync all of the battery cells 212 at the same EOC and EOD points.

Multiple outlier battery cells 212A-B can be identified and multiple outlier battery cell identifiers 349A-B can be stored—similarly, when checking for an outlier battery rack 210A, multiple outlier battery racks 210A-B can be identified at once. Generally, barring outside interference such as physical damage to the energy storage system 100, only one battery cell 212A in one battery rack 210A will be an outlier at a single time: once a single outlier battery cell 212A is identified, the operator often will take immediate action to repair or replace that outlier battery cell 212A. In some implementations, the outlier battery cell 212A or outlier battery rack or element 210A can also be deactivated or disconnected from the remainder of the battery rack or element 210A, battery node 110A, or the remaining collecting of battery nodes 110B-N. Doing so could allow the energy storage system 100 to be able to fully charge and discharge, in exchange for the lost capacity of the offline battery cell 212A, battery rack or element 210A, or battery node 110A.

After an outlier battery cell 212A is identified, the operator may be interested in the particular type of abnormal behavior the battery cell 212A is exhibiting. Four such types of abnormal behavior can include high resistance, low capacity, being out of balance at the high end, and being out of balance at the low end. High resistance or low capacity battery cells generally are replaced, while out of balance (either high or low) battery cells may be repaired or rebalanced. To characterize the outlier battery cell 212A in one of these categories, several data points should be collected.

In a given charge cycle, the voltage of the battery cell 212A at EOC is stored as the EOC cell voltage 351, and the voltage of all cell voltages in the entire battery rack 210A at EOC is stored as the EOC average rack voltage value 361. The voltage of the battery cell 212A at EOD is stored as the EOD cell voltage 355, and the voltage of the entire battery rack 210A at EOD is stored as the EOD average rack voltage value 365. The voltage of the battery cell 212A at middle-of-discharge (MOD) is stored as the MOD cell voltage 353, and the voltage of the entire battery rack 210A at MOD is stored as the EOD average rack voltage value 363.

While identifying high resistance, low capacity, out of balance at the high end, and out of balance at the low end battery cells 212 may be performed most efficiently with voltages (i.e., EOC cell voltage 351, MOD cell voltage 353, EOD cell voltage 355, EOC Average Rack Voltage Value 361, MOD Average Rack Voltage Value 363, EOD Average Rack Voltage Value 365), other analogous performance values, such as amperage or temperature, may be used. Consequently, the performance monitoring system may store in a given charge cycle an EOC cell performance value 351, an MOD cell performance value 353, an EOD cell performance value 355, an EOC average element performance value 361, an MOD average element performance value 363, and an EOD average element performance value 365.

Though the figure depicts storing a single copy of cell voltages or performance values 351, 353, 355 and rack voltages or element performance values 361, 363, 365, in some embodiments every battery cell 212A-R and every battery rack or element 210A-G has a copy of these of cell voltages or performance values 351 ,353, 355 and rack voltages or element performance values 361, 363, 365 saved in the memory 335. If every value is saved, then a single charge cycle can be utilized to identify an outlier rack 210A, an outlier cell 212A, and the characteristics of the outlier cell 212A.

Figure 4:
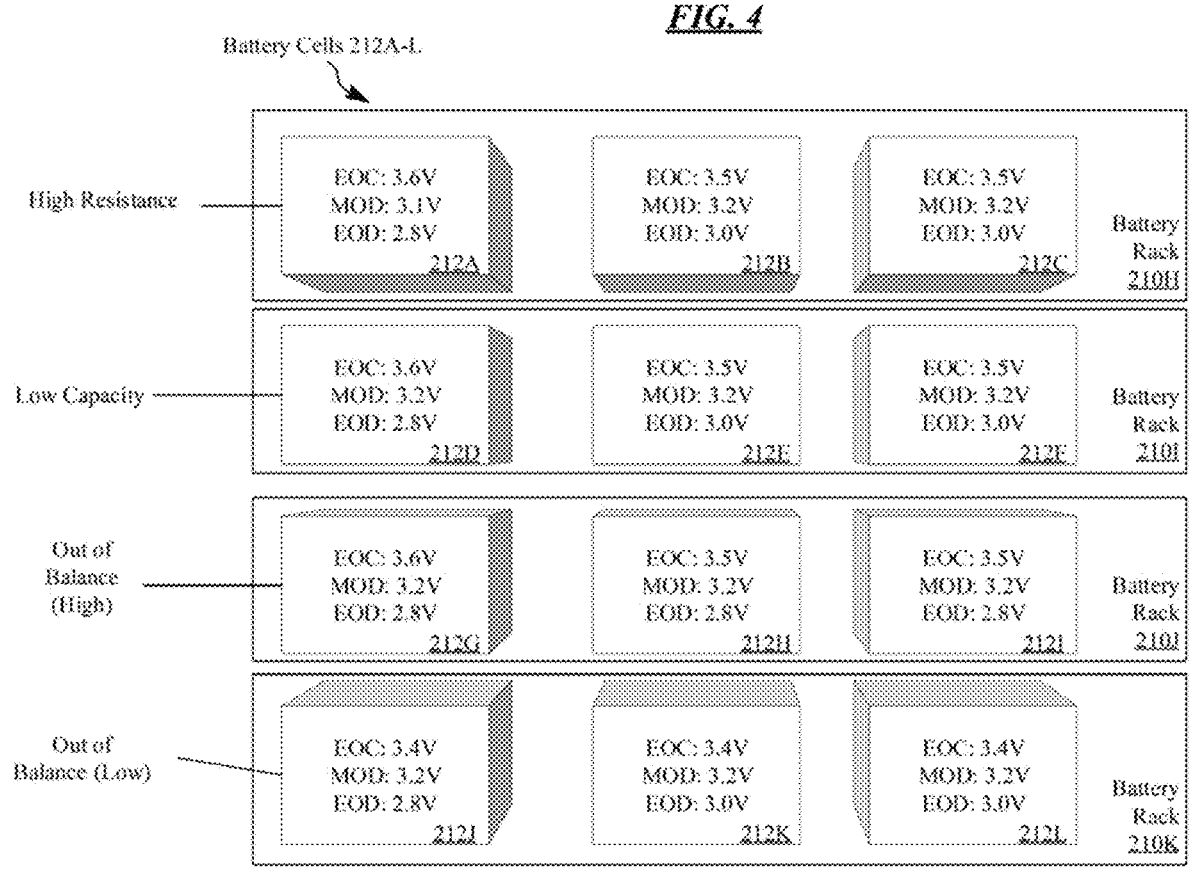
FIG. 4 is a diagram of a plurality of battery cells in battery racks or elements, with a subset of the cells in various categorizations of outlier status.

FIG. 4 is a diagram of a plurality of battery cells 212A-L, with a subset of the battery cells 212A,D,G,J in various categorizations of outlier status. Each battery cell 212A-L is configured to generally target three voltages: a voltage of 3.6 volts at EOC, a voltage of 3.2 volts at MOD, and a voltage of 2.8 volts at EOD.

To characterize the issue type of the outlier battery cells 212A,D,G,J, the cell voltage differences at different points in cycling are compared. The voltage difference is calculated at EOC, EOD, and in the middle of discharge (MOD). The voltage difference is calculated by comparing the EOC cell voltage 351 to the average EOC cell voltage 361 of all cells in the rack 361, the MOD cell voltage 353 to the average MOD cell voltage of all cells in the rack 363, and the EOD cell voltage 355 to the average EOD cell voltage of all cells in the rack 365. Outlier battery cells 212A,D,G,J are classified into four types: high resistance, low capacity, high out of balance, or low out of balance.

High resistance battery cells 212A have greater opposition to electron or ion flow. By Ohm's law (V=IR), higher resistance means a greater voltage drop or rise (depending on whether the battery cell 212A is discharging or charging). A high resistance battery cell 212A reaches the cut-off voltages early due to the voltage curve shift, limiting full access to the battery cell's 212A capacity and preventing other battery cells 212B-L from fully cycling. Whenever a load is applied to the high resistance battery cell 212A, the voltage will deviate largely from the average cell voltage, i.e. the voltage difference will be large at EOC, EOD, and MOD.

Battery cell 212A can be seen experiencing high resistance: the EOC value for the battery cell 212A is greater than the other two EOC values within the battery rack 210H, the MOD value is lower than the other two MOD values within the battery rack 210H, and the EOD value is lower than the other two EOD values within the battery rack 210H.

A low capacity battery cell 212D has less available ions to participate in charge transfer. Low capacity can be caused by a multitude of degradation mechanisms, including active material loss, SEI formation, or lithium plating, or by manufacturing defects. The low capacity battery cell 212D inherently has less capacity than other battery cells 212E-F in the battery rack 210I. This battery cell 212D reaches the voltage cut-off limits earlier than the other battery cells 212 E-F and subsequently limits the other battery cells 212E-F from being fully cycled. Low capacity battery cells 212D are detected by large voltage differences at EOC and EOD with low voltage difference at MOD.

Battery cell 212D can be seen experiencing low capacity: the EOC value for the battery cell 212D is greater than the other two EOC values within the battery rack 210I, the MOD value is close to the other two MOD values within the battery rack 210I, and the EOD value is lower than the other two EOD values within the battery rack 210I.

An out of balance battery cell 212G,J is a battery cell 212G,J that is more charged or more discharged than other battery cells 212H-I, 212K-L in the battery rack 210J-K. A high out of balance battery cell 212G can be observed as a higher voltage than other battery cells 212H-I in the battery rack 210J throughout the entirety of cycling, even during the rest phases. A low out of balance battery cell 212J can be observed as a lower voltage than other battery cells 212K-L in the battery rack 210K throughout the entirety of cycling, even during the rest phases.

A high out of balance battery cell 212G is more charged than the other battery cells 212H-I has a higher voltage, hits the battery cell 212G upper voltage limit earlier than other battery cells 212H-I, and thus limits the total battery rack 210J charge capacity. Conversely, an out of balance battery cell 212J that is more discharged has a lower voltage, hits the lower voltage limit early, and limits the total battery rack 210K discharge capacity.

Battery cell 212G can be seen experiencing high out of balance: the EOC value for the battery cell 212G is greater than the other two EOC values within the battery rack 210J, and the EOD value is close the other two EOD values within the battery rack 210J. Note that the MOD values are not generally used to determine a high out of balance battery cell 212G.

Battery cell 212J can be seen experiencing low out of balance: the EOC value for the battery cell 212G is close to the other two EOC values within the battery rack 210K, and the EOD value is lower than the other two EOD values within the battery rack 210K. Note that the MOD values are not generally used to determine a low out of balance battery cell 212J.

Figure 5:
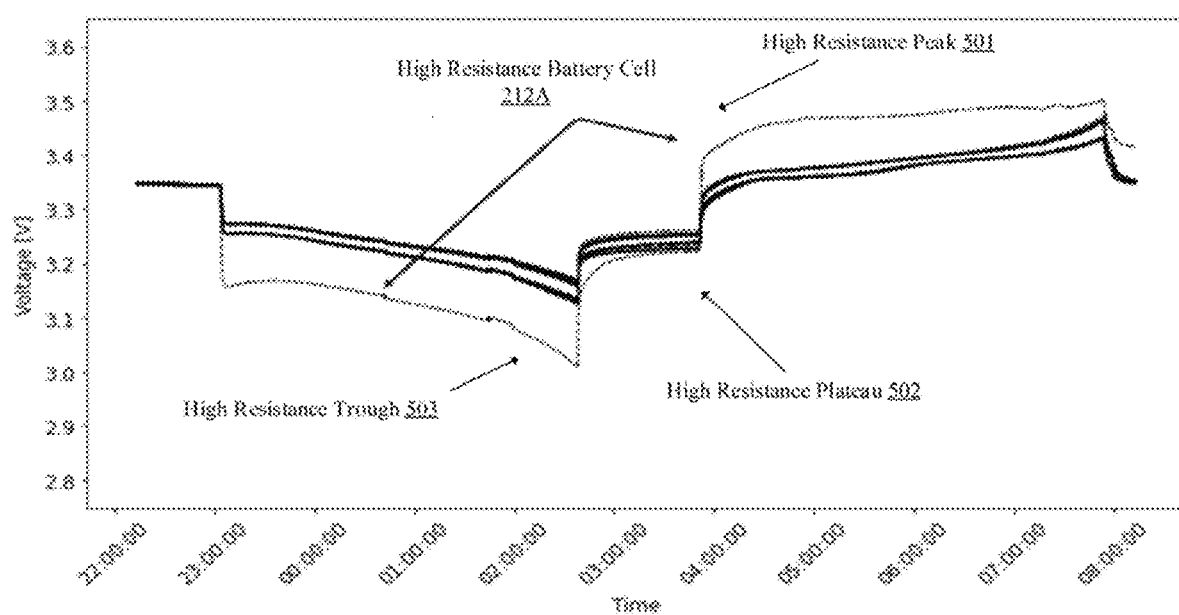
FIG. 5 is a graph of the cell voltage over time of an outlier battery cell categorized as a high resistance cell, as compared to non-outlier battery cells.

FIG. 5 is a graph of the cell voltage over time of an outlier battery cell 212A categorized as a high resistance cell, as compared to non-outlier battery cells 212B-C. As described in FIG. 4, it can be seen that, over time, the peaks of voltage at EOC are higher for the outlier battery cell 212A, the voltage in the MOD is lower for the outlier battery cell 212A, and the troughs of voltage at EOD is lower for the outlier battery cell 212A.

Figure 6:
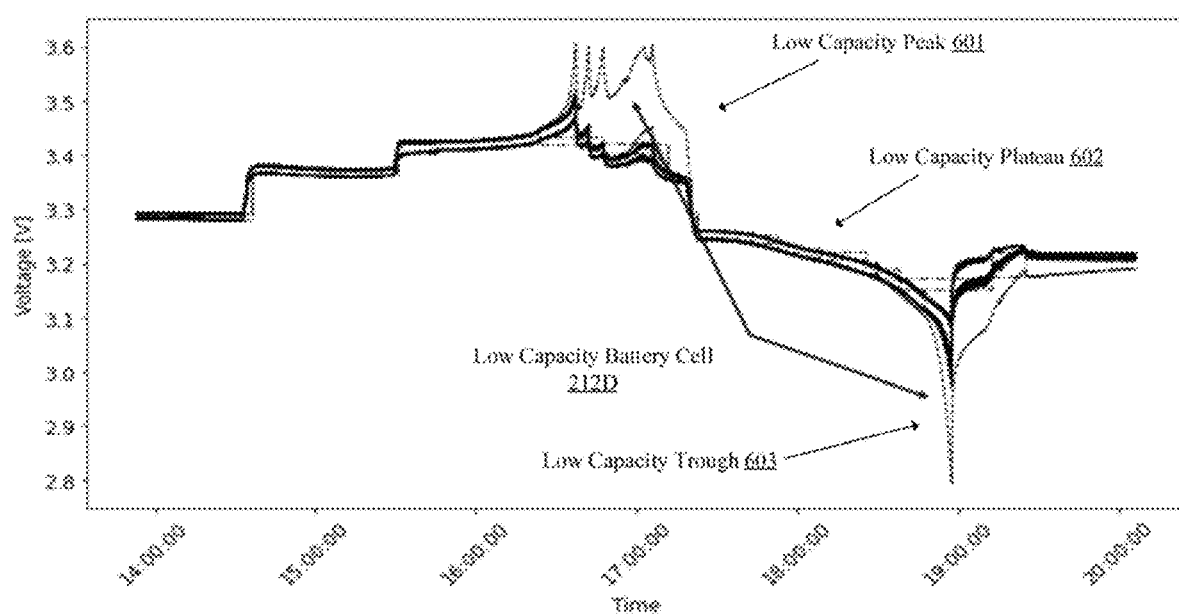
FIG. 6 is a graph of the cell voltage over time of an outlier battery cell categorized as a low capacity cell, as compared to non-outlier battery cells.

FIG. 6 is a graph of the cell voltage over time of an outlier battery cell 212D categorized as a low capacity cell, as compared to non-outlier battery cells 212E-F. As described in FIG. 4, it can be seen that, over time, the peaks of voltage at EOC are higher for the outlier battery cell 212D, the voltage in the MOD conforms to the average for the outlier battery cell 212D, and the troughs of voltage at EOD is lower for the outlier battery cell 212D.

Figure 7:
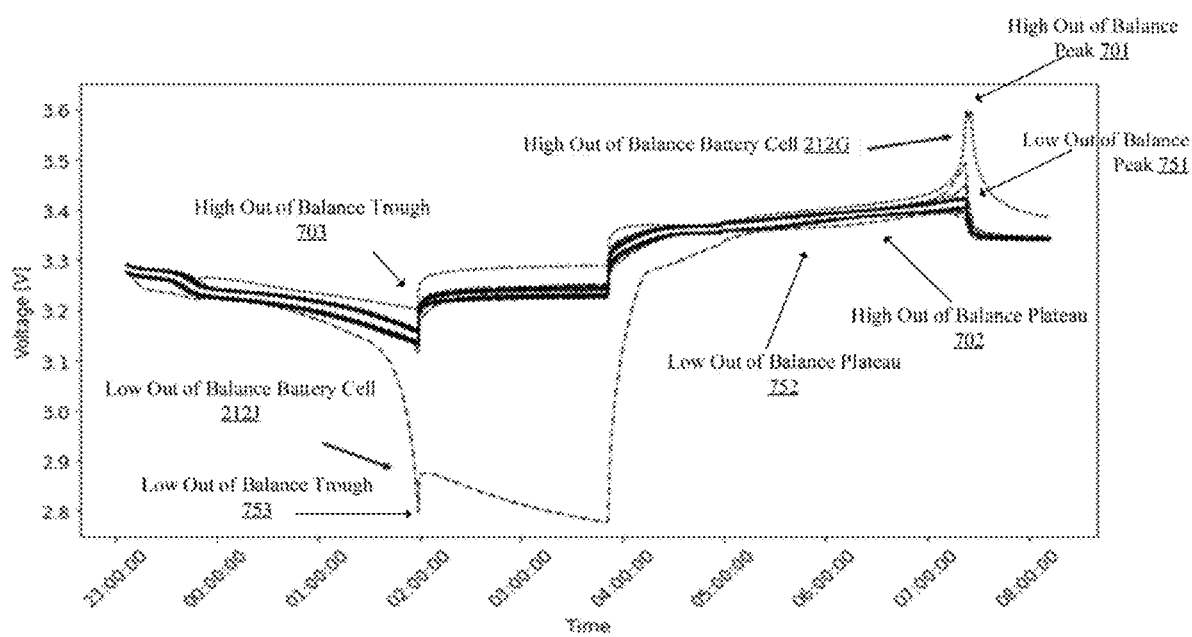
FIG. 7 is a graph of the cell voltage over time of two outlier battery cells categorized as a high out of balance cell and a low out of balance cell, as compared to non-outlier battery cells.

FIG. 7 is a graph of the cell voltage over time of two outlier battery cells 212G,J categorized as a high out of balance cell 212G and a low out of balance cell 212J, as compared to non-outlier battery cells 212H-I,K-L. As described in FIG. 4, it can be seen that, over time, the peaks of voltage at EOC are higher for the outlier battery cell 212G and the troughs of voltage at EOD conform to the average for the outlier battery cell 212G. Additionally, the peaks of voltage at EOC conform to the average for the outlier battery cell 212J and the troughs of voltage at EOD are lower for the outlier battery cell 212J.

Therefore, FIGS. 1-7 depict a battery cell performance monitoring system 1 including an energy storage system 100 that includes at least one inverter 104 and a plurality of battery nodes 110A-N. Each of the battery nodes 110A includes a plurality of battery racks 210A-F. Each of the battery racks 210A include a respective plurality of battery cells 212A-N. The battery cell performance monitoring system 1 also includes a processor 330 and a memory 335 coupled to the processor 330. The memory comprises performance monitoring programming 337, which when executed configures the battery cell performance monitoring system 1 to implement the following functions. First, to determine an extreme rack cell voltage value 339A-G of each battery rack 210A-G. Second, to determine an average extreme rack cell voltage value 341 based on the extreme rack cell voltage value 339A-G of each battery rack 210A-G. Third, to compare an extreme rack cell voltage value 339A-G for each battery rack 210A-G with the average extreme rack cell voltage value 341. Fourth, to identify one or more outlier battery racks 210A based upon the comparison of the extreme rack cell voltage value 339A-G for each battery rack 210A-G with the average extreme rack cell voltage value 341.

The determination of the extreme rack cell voltage value 339A can be based on a charge portion or a discharge portion of a cycle or a combination thereof. A cycle includes charging a battery cell 212A from an energy source 102, as well as discharging a battery cell 212A to power a connected load 106. The determination of the extreme rack cell voltage value 399A can be made at the end of the charge portion of the cycle, or the determination of the extreme rack cell voltage value is made at the end of the discharge portion of the cycle.

The extreme rack cell voltage value 339A can describe excessively high voltage as compared to other battery racks 210B-G in the energy storage system 100, where excessively high voltage can be voltage as little as one percent higher than the voltage of the other battery racks 210B-G in the energy storage system 100. The extreme rack cell voltage value 339A can describe excessively low voltage as compared to other battery racks 210B-G in the energy storage system 100, where excessively low voltage can be voltage as little as one percent lower than the voltage of the other battery racks 210B-G in the energy storage system 100.

Executing the performance monitoring programming 337 can further configure the battery cell performance monitoring system 1 to implement the following functions. First, to determine an average rack cell voltage value 347A of a respective battery rack 210A. Second, to compare a cell voltage value 345A-D for each battery cell 212A-D of the plurality of battery cells 212A-D of the respective battery rack 210A with the average rack cell voltage value 347A. Third, based upon the comparison of the cell voltage value 345A-D of each battery cell 212A-D to the average rack cell voltage value 347A, to identify one or more outlier battery cells 212A.

In calculating the average extreme rack cell voltage value 341, or the average rack cell voltage value 347A, any averaging method may be used: calculating a mean, median, mode, and calculating an average by performing a "leave one out" averaging (e.g., when calculating the average against which battery cell 212A is to be compared, use battery cells 212B-D; when calculating the average against which battery cell 212B is to be compared, use battery cells 212A,C-D, etc.) Further decisions can be made to exclude or weight different values into the averaging. The average can also be an expected performance value, based on the manufacturer's specifications regarding the battery cells 212A-D. That expected performance value may be modified by a degradation function, for example expecting a 10% loss of functionality every year the battery cells 212A-D are in use, or a 1% loss of functionality every one thousand charge cycles.

Executing the performance monitoring programming 337 can further configure the battery cell performance monitoring system 1 to implement the following functions. First, to determine an end-of-charge (EOC) cell voltage 351, an end-of-discharge (EOD) cell voltage 355, and a middle of discharge (MOD) cell voltage 353 of a first outlier cell 212A of the one or more outlier battery cells 212A. Second to determine an EOC average rack cell voltage value 361, an EOD average rack cell voltage value 365, and a MOD average rack cell voltage value of the respective battery rack 363. Third, to characterize the first outlier cell 212A as a high resistance cell in response to the EOC cell voltage 351 substantially deviating from the EOC average rack cell voltage value 361, the EOD cell voltage 355 substantially deviating from the EOD average rack cell voltage value 365, and the MOD cell voltage 353 substantially deviating from the MOD average rack cell voltage value 363.

Fourth, to characterize the first outlier cell 212D as a low capacity cell in response to the EOC cell voltage 351 substantially deviating from the EOC average rack cell voltage value 361, the EOD cell voltage 355 substantially deviating from the EOD average rack cell voltage value 365, and the MOD cell voltage 253 being substantially similar to the MOD average rack cell voltage value 363.

Fifth, to characterize the first outlier cell 212G as an out of balance cell in response to the EOC cell voltage 351 substantially deviating from the EOC average rack cell voltage value 361, and the EOD cell voltage 355 being substantially similar to EOD average rack cell voltage value 365.

FIGS. 1-7 also depict a battery cell performance monitoring system 1 including an energy storage system 100 that includes at least one inverter 104 and a plurality of battery nodes 110A-N. Each of the battery nodes 110A includes a plurality of battery elements 210A-F. Each of the battery elements 210A include a respective plurality of battery cells 212A-N. The battery cell performance monitoring system 1 also includes a processor 330 and a memory 335 coupled to the processor 330. The memory comprises performance monitoring programming 337, which when executed configures the battery cell performance monitoring system 1 to implement the following functions. First, to determine an extreme element cell performance value 339A-G of each battery element 210A-G. Second, to determine an average extreme element cell performance value 341 based on the extreme element cell performance value 339A-G of each battery element 210A-G. Third, to compare an extreme element cell performance value 339A-G for each battery element 210A-G with the average extreme element cell performance value 341. Fourth, to identify one or more outlier battery elements 210A based upon the comparison of the extreme element cell performance value 339A-G for each battery element 210A-G with the average extreme element cell performance value 341.

The determination of the extreme element cell performance value 339A can be based on a charge portion or a discharge portion of a cycle or a combination thereof. A cycle includes charging a battery cell 212A from an energy source 102, as well as discharging a battery cell 212A to power a connected load 106. The determination of the extreme element cell performance value 399A can be made at the end of the charge portion of the cycle, or the determination of the extreme element cell performance value is made at the end of the discharge portion of the cycle.

The extreme element cell performance value 339A can describe excessively high voltage, amperage, temperature, or other qualities as compared to other battery elements 210B-G in the energy storage system 100, where excessively high voltage can be voltage as little as one percent higher than the voltage of the other battery elements 210B-G in the energy storage system 100. The extreme element cell voltage value 339A can describe excessively low voltage, amperage, temperature, or other qualities as compared to other battery elements 210B-G in the energy storage system 100, where excessively low voltage can be voltage as little as one percent lower than the voltage of the other battery elements 210B-G in the energy storage system 100.

Executing the performance monitoring programming 337 can further configure the battery cell performance monitoring system 1 to implement the following functions. First, to determine an average element cell performance value 347A of a respective battery element 210A. Second, to compare a cell performance value 345A-D for each battery cell 212A-D of the plurality of battery cells 212A-D of the respective battery element 210A with the average element cell performance value 347A. Third, based upon the comparison of the cell performance value 345A-D of each battery cell 212A-D to the average element cell performance value 347A, to identify one or more outlier battery cells 212A.

In calculating the average extreme element cell performance value 341, or the average element cell performance value 347A, any averaging method may be used: calculating a mean, median, mode, and calculating an average by performing a "leave one out" averaging (e.g., when calculating the average against which battery cell 212A is to be compared, use battery cells 212B-D; when calculating the average against which battery cell 212B is to be compared, use battery cells 212A,C-D, etc.) Further decisions can be made to exclude or weight different values into the averaging. The average can also be an expected performance value, based on the manufacturer's specifications regarding the battery cells 212A-D. That expected performance value may be modified by a degradation function, for example expecting a 10% loss of functionality every year the battery cells 212A-D are in use, or a 1% loss of functionality every one thousand charge cycles.

Executing the performance monitoring programming 337 can further configure the battery cell performance monitoring system 1 to implement the following functions. First, to determine an end-of-charge (EOC) cell performance value 351, an end-of-discharge (EOD) cell performance value 355, and a middle of discharge (MOD) cell performance value 353 of a first outlier cell 212A of the one or more outlier battery cells 212A. Second to determine an EOC average element cell performance value 361, an EOD average element cell performance value 365, and a MOD average element cell performance value of the respective battery element 363. Third, to characterize the first outlier cell 212A as a high resistance cell in response to the EOC cell performance value 351 substantially deviating from the EOC average element cell performance value 361, the EOD cell performance value 355 substantially deviating from the EOD average element cell performance value 365, and the MOD cell performance value 353 substantially deviating from the MOD average element cell performance value 363.

Fourth, to characterize the first outlier cell 212D as a low capacity cell in response to the EOC cell performance value 351 substantially deviating from the EOC average element cell performance value 361, the EOD cell performance value 355 substantially deviating from the EOD average element cell performance value 365, and the MOD cell performance value 253 being substantially similar to the MOD average element cell performance value 363.

Fifth, to characterize the first outlier cell 212G as an out of balance cell in response to the EOC cell performance value 351 substantially deviating from the EOC average element cell performance value 361, and the EOD cell performance value 355 being substantially similar to EOD average element cell performance value 365.

FIG. 8 is a flowchart depicting a cell and element performance monitoring protocol 800. The battery cell performance monitoring system 1 implements the performance monitoring protocol 800 to determine battery elements or racks 210 and battery cells 212 which have outlier performance.

The energy storage system 100 first runs a full charge-discharge cycle. Test data is stored in the performance monitoring sub-system 112. In some examples, that test data is uploaded via ethernet to a central data acquisition system (DAS) implementing some of the functions of the performance monitoring sub-system 112 and the performance monitoring protocol 800. An analysis script pulls in data for analysis and two analysis processes are performed; capacity and energy calculations and outlier cell identification.

Capacity in Amp-hour is calculated by integrating current with respect to time. Energy in Watt-hour is calculated by integrating power (voltage times current) with respect to time. In this analysis method, the performance monitoring protocol 800 differentiates between charge and discharge steps to calculate charge and discharge capacity and energy separately. Both battery node 110A and battery elements or racks 210A capacity and energy are calculated using this method. However, battery element capacity is only calculated for battery nodes 110A which are identified with a calculated low capacity. To perform the analysis the battery node/element data is first pulled into the analysis script in the performance monitoring sub-system 112. Charge and discharge start and stop times are identified and then current is integrated to get capacity and power is integrated to get energy. The analysis is run in parallel to analyze multiple battery nodes/elements concurrently and reduce computation time.

The capacity data of the battery nodes 110A-N and battery elements 210A-N is then leveraged to identify outlier battery cells 212A. Outlier battery cells 212A limit the capacity of the entire battery node 110A and battery element 210A because charge or discharge terminates once just one battery cell 212A reaches the upper or lower voltage limit in the battery node 110A, battery element 210A, or energy storage system 100. However, it is computationally expensive to analyze all battery cell data because there can be hundreds of battery cells 212A-N in a single battery node 110A and multiple nodes in an energy storage system 100. Instead, outlier cell containing battery elements or racks 210A are first identified and then battery cell data is examined in-depth for just those problem battery elements 210A.

Outlier cell containing elements 210A are identified using battery element maximum and minimum cell voltage data, also called extreme element cell performance value 339A. The element maximum/minimum cell voltage data points (or extreme element cell performance value 339A) records the voltage of a battery cell 212A that has the highest or lowest voltage of all battery cells 212A-N in the battery element 210A. In a non-outlier cell containing battery element 210C, the highest and lowest voltage battery cells constantly fluctuate between many battery cells because all battery cells in the battery element 210C have near identical voltages. In an outlier cell containing element 210A, a single cell 212A may consistently have the highest and/or lowest voltage, indicating that the battery cell 212A is performing differently than other battery cells 212B-N.

Outlier battery cells 212A become most obvious at end of charge (EOC) and/or at end of discharge (EOD) because a low capacity, high resistance, or out of balance battery cell will reach the cut-off voltage before the other, non-problematic battery cells 212B-N. EOC can be defined as ten minutes before and ten minutes after charge, and EOD can be defined as ten minutes before and ten minutes after discharge. The maximum and minimum cell voltages (or extreme rack cell voltage value 339A) of each battery rack 210A-N at the EOC and EOD are examined. The outlier is also more obvious at EOC/EOD because of the nature of the voltage curves. Certain batteries typically have long plateaus in the middle of discharge, where voltage changes very little even though battery capacity may be changing at lot.

The maximum/minimum cell voltage of each battery rack 210A-N is compared against the average maximum/minimum cell voltage of all racks in the node to determine if the cell voltage of one battery rack 210A is "largely different" from the cell voltages of the other battery racks 210B-N. The difference between each battery rack's 210A-F maximum cell voltage at EOC and the average rack maximum cell voltage at EOC and the difference between each battery rack's 210A-F min cell voltage at EOD and the average rack minimum cell voltage at EOD are calculated. The difference at EOC can be >80 millivolts (mV) or the difference at EOD can be >50 mV: if so, then the battery rack 210A is flagged as containing an outlier cell 212A. Note that these values are subjective. Lower or higher threshold values can be used depending on the user's definition of "largely different" cell voltages.

Simply using the maximum/minimum cell voltages results in only identifying at most one or two outlier cells 212A (depending on if the same or different cells are outlier at EOC vs EOD) in a single battery rack. Using the individual cell voltage data can identify all outlier cells 212A within the battery rack 210A. In this process, each battery cell's 212A-N voltage is compared against the average cell voltage 347A of the entire battery rack 210A. The differences between cell voltage and average cell voltage are calculate at EOC and EOD when differences are most prominent. The difference at EOC can be >80 mV or the difference at EOD can be >50 mV: if so, then the battery cell 212A is flagged as an outlier.

To characterize the issue type of the outlier cell 212A, the cell voltage differences at different points in cycling are compared. The voltage difference is calculated at EOC, EOD, and in the middle of discharge (MOD). Outlier battery cells 212A are classified into four types: high resistance, low capacity, high out of balance, or low out of balance.

Though the prior description discloses analysis based upon performance values related to voltages, similar analysis can be performed with performance values based upon other qualities, such as amperage or temperature.

Therefore, in order to identify an outlier battery rack 210A, in step 805 the performance monitoring protocol 800 determines an extreme element cell performance value 339A of each battery element 210A of a plurality of battery elements 210A-N. In step 810, the performance monitoring protocol 800 determines an average extreme element cell performance value 341 based on the extreme element cell performance value 339A-G of each battery element 210A-G. In step 815, the performance monitoring protocol 800 compares an extreme element cell performance value 339A-G for each battery element 210A-G with the average extreme element cell performance value 341. In step 820, based upon the comparison of the extreme element cell performance value 339A-G for each battery element 210A-G with the average extreme element cell performance value 341, the performance monitoring protocol 800 identifies one or more outlier battery racks 210A.

Next, in order to identify an outlier battery cell 212A, in step 825 the performance monitoring protocol 800 determines an average element cell performance value 347A of a respective battery rack 210A. In step 830, the performance monitoring protocol 800 compares a cell performance value 345A for each battery cell 212A of a plurality of battery cells 212A-D of the respective battery element 210A with the average element cell performance value 347A. In step 835, based upon the comparison of the cell performance value 345A-D of each battery cell 212A-D to the average element cell performance value 347A, the performance monitoring protocol 800 identifies one or more outlier battery cells 212A.

In order to characterize the outlier battery cell 212A, in step 840 the performance monitoring protocol 800 determines an end-of-charge (EOC) cell performance value or voltage 351, an end-of-discharge (EOD) cell performance value or voltage 355, and a middle of discharge (MOD) cell performance value or voltage 353 of a first outlier cell 212A of the one or more outlier battery cells 212A. In step 845, the performance monitoring protocol 800 determines an EOC average element cell performance value 361, an EOD average element cell performance value 365, and a MOD average element cell performance value 363 of the respective battery element 210A. Finally, to characterize the outlier battery cell 212A, the performance monitoring protocol 800, proceeds through steps 850, 855, and 860, and attempts to characterize the first outlier cell 212A as either a high resistance cell, a low capacity cell or an out of balance cell.

Alternatively, before step 805, similar steps to step 805, 810, 815, and 820 may first be performed: however, in those alternative steps, an outlier battery node is identified based upon an extreme node cell performance value. In particular, the steps would include first, determining an extreme node element performance value of each battery node of a plurality of battery nodes. Second, determining an average extreme node element performance value based on the extreme node element performance value of each battery node. Third, comparing an extreme node element performance value for each battery node with the average extreme node element performance value. Fourth, identifying one or more outlier battery nodes. Once one or more outlier battery nodes are identified, step 805 proceeds, but only among the battery elements of outlier battery nodes.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A battery cell performance monitoring system, comprising:
   an energy storage system that includes at least one inverter and a plurality of battery nodes, wherein:
      each of the battery nodes includes a plurality of battery racks, and
      each of the battery racks include a respective plurality of battery cells;
   a processor; and
   a memory, coupled to the processor;
   wherein the memory comprises performance monitoring programming, which when executed configures the battery cell performance monitoring system to implement functions, including functions to:
      determine an extreme rack cell voltage value of each battery rack;
      determine an average extreme rack cell voltage value based on the extreme rack cell voltage value of each battery rack;
      compare the extreme rack cell voltage value for each battery rack with the average extreme rack cell voltage value; and
      identify one or more outlier battery racks based upon the comparison of the extreme rack cell voltage value for each battery rack with the average extreme rack cell voltage value; wherein:
      the one or more outlier battery racks each include one or more low performing battery cells of the respective plurality of battery cells; and
      the one or more low performing battery cells individually exhibit:
         i) high resistance,
         ii) low capacity, or
         iii) being out of balance,
   and are capable of providing electricity to an external source or receiving electricity from the external source.

2. The battery cell performance monitoring system of claim 1, wherein:
   the determination of the extreme rack cell voltage value is based on a charge portion or a discharge portion of a cycle or a combination thereof.

3. The battery cell performance monitoring system of claim 2, wherein the determination of the extreme rack cell voltage value is made at the end of the charge portion.

4. The battery cell performance monitoring system of claim 3, wherein the extreme rack cell voltage value describes excessively high voltage as compared to other battery racks in the energy storage system.

5. The battery cell performance monitoring system of claim 2, wherein the determination of the extreme rack cell voltage value is made at the end of the discharge portion.

6. The battery cell performance monitoring system of claim 5, wherein the extreme rack cell voltage value describes excessively low voltage as compared to other battery racks in the energy storage system.

7. A method, comprising:
   determining an extreme element cell performance value of each battery element of a plurality of battery elements;
   determining an average extreme element cell performance value based on the extreme element cell performance value of each battery element;
   comparing the extreme element cell performance value for each battery element with the average extreme element cell performance value; and
   based upon the comparison of the extreme element cell performance value for each battery element with the average extreme element cell performance value, identifying one or more outlier battery elements.

8. The method of claim 7, wherein:
   the determination of the extreme element cell performance value is based on a charge portion or a discharge portion of a cycle or a combination thereof.

9. The method of claim 8, wherein the determination of the extreme element cell performance value is made at the end of the charge portion.

10. The method of claim 9, wherein the extreme element cell performance value describes excessively high voltage as compared to other battery racks in the energy storage system.

11. The method of claim 8, wherein the determination of the extreme element cell performance value is made at the end of the discharge portion.

12. The method of claim 7, further comprising:
   determining an average element cell performance value of a respective battery element;
   comparing a cell performance value for each battery cell of a plurality of battery cells of the respective battery element with the average element cell performance value;
   based upon the comparison of the cell performance value of each battery cell to the average element cell performance value, identifying one or more outlier battery cells.

13. The method of claim 12, further comprising:
   determining an end-of-charge (EOC) cell performance value, an end-of-discharge (EOD) cell performance value, and a middle of discharge (MOD) cell performance value of a first outlier cell of the one or more outlier battery cells;

determining an EOC average element cell performance value, an EOD average element cell performance value, and a MOD average element cell performance value of the respective battery element;

characterizing the first outlier cell as a high resistance cell in response to:
i) the EOC cell performance value deviating from the EOC average element cell performance value,
ii) the EOD cell performance value deviating from the EOD average element cell performance value, and
iii) the MOD cell performance value deviating from the MOD average element cell performance value.

14. The method of claim 13, further comprising:
determining an end-of-charge (EOC) cell performance value and an end-of-discharge (EOD) cell performance value of a first outlier cell of the one or more outlier battery cells;
determining an EOC element performance and an EOD element performance value of the respective battery element;
characterizing the first outlier cell as an out of balance cell in response to:
i) the EOC cell performance value deviating from the EOC element performance value and the EOD cell performance value is similar to the EOD element performance value, or
ii) the EOC cell performance value being similar to the EOC element performance value and the EOD cell performance value deviates from the EOD element performance value.

15. The method of claim 12, further comprising:
determining an end-of-charge (EOC) cell performance value, an end-of-discharge (EOD) cell performance value, and a middle of discharge (MOD) cell performance value of a first outlier cell of the one or more outlier battery cells;
determining an EOC average element cell performance value, an EOD average element cell performance value, and a MOD average element cell performance value of the respective battery element;
characterizing the first outlier cell as a low capacity cell in response to:
i) the EOC cell performance value substantially deviating from the EOC average element cell performance value,
ii) the EOD cell performance value substantially deviating from the EOD average element cell performance value, and
iii) the MOD cell performance value being substantially similar to the MOD average element cell performance value.

16. A battery cell performance monitoring system, comprising:
an energy storage system that includes at least one inverter and a plurality of battery nodes, wherein:
each of the battery nodes includes a plurality of battery elements, and
each of the battery elements include a respective plurality of battery cells;
a processor; and
memory, coupled to the processor;
wherein the memory comprises performance monitoring programming, which when executed, configures the battery cell performance monitoring system to implement functions, including functions to:
determine an extreme element cell performance value of each battery element;
determine an average extreme element cell performance value based on the extreme element cell performance value of each battery element;
compare the extreme element cell performance value for each battery element with the average extreme element cell performance value; and
identify one or more outlier battery elements based upon the comparison of the extreme element cell voltage value for each battery element with the average extreme element cell performance values;
determine an average element cell voltage value of a respective battery element;
compare a cell voltage value for each battery cell of the plurality of battery cells of the respective battery element with the average element cell voltage value;
based upon the comparison of the cell voltage value of each battery cell to the average element cell voltage value, identify one or more outlier battery cells;
determine an end-of-charge (EOC) cell voltage, an end-of-discharge (EOD) cell voltage, and a middle of discharge (MOD) cell voltage of a first outlier cell of the one or more outlier battery cells; and
determine an EOC average element cell voltage value, an EOD average element cell voltage value, and a MOD average element cell voltage value of the respective battery element.

17. The battery cell performance monitoring system of claim 16, wherein:
wherein executing the performance monitoring programming further configures the battery cell performance monitoring system to implement functions, including functions to:
characterize the first outlier cell in response to:
i) the EOC cell voltage deviating from the EOC average element cell voltage value or the EOC cell voltage being similar to the EOC average element cell voltage value,
ii) the EOD cell voltage deviating from the EOD average element cell voltage value or the EOD cell voltage being similar to the EOD average element cell voltage value,
iii) the MOD cell voltage deviating from the MOD average element cell voltage value or the MOD cell voltage being similar to the MOD average element cell voltage value; or
iv) a combination thereof.

18. The battery cell performance monitoring system of claim 16, wherein:
the one or more outlier battery elements each include one or more low performing battery cells of the respective plurality of battery cells;
a respective low performing battery cell of the one or more low performing battery cells limits a capacity of each other battery cell of the respective plurality of battery cells.

19. The battery cell performance monitoring system of claim 18, wherein:
the respective low performing battery cell limits the capacity of the each other battery cells of the respective plurality of battery cells by terminating charge or discharge of a respective battery node of the plurality of battery nodes including a respective battery rack of the respective plurality of battery racks including the respective low performing battery cell.

20. The battery cell performance monitoring system of claim 19, wherein:

the respective low performing battery cell limits the capacity of a plurality of respective battery cells of the respective plurality of battery racks by terminating charge or discharge of the respective battery node.

* * * * *